(12) United States Patent
Sato et al.

(10) Patent No.: US 9,007,161 B2
(45) Date of Patent: Apr. 14, 2015

(54) METHOD OF MANUFACTURING CERAMIC ELECTRONIC COMPONENT, CERAMIC ELECTRONIC COMPONENT, AND WIRING BOARD

(71) Applicant: Murata Manufacturing Co., Ltd., Nagaokakyo-shi, Kyoto-fu (JP)

(72) Inventors: Koji Sato, Nagaokakyo (JP); Yukio Sanada, Nagaokakyo (JP); Yasuhiro Nishisaka, Nagaokakyo (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 0 days.

(21) Appl. No.: 14/339,506

(22) Filed: Jul. 24, 2014

(65) Prior Publication Data
US 2014/0332260 A1 Nov. 13, 2014

Related U.S. Application Data

(62) Division of application No. 13/184,607, filed on Jul. 18, 2011, now Pat. No. 8,819,932.

(30) Foreign Application Priority Data

Jul. 21, 2010 (JP) ................................. 2010-164112

(51) Int. Cl.
*H05K 1/18* (2006.01)
*H01C 1/14* (2006.01)
(Continued)

(52) U.S. Cl.
CPC ........... *H05K 1/183* (2013.01); *Y10T 29/49124* (2015.01); *Y10T 29/49117* (2015.01); *Y10T 29/49155* (2015.01); *Y10T 29/49144* (2015.01); *Y10T 29/49085* (2015.01); *Y10T 29/49126* (2015.01); *H01C 1/14* (2013.01); *H01C 7/008* (2013.01); *H01C 7/02* (2013.01); *H01G 2/06* (2013.01); *H01G 4/228* (2013.01); *H05K 1/186* (2013.01); *H05K 3/321* (2013.01); *H05K 2201/10636* (2013.01); *H01F 27/2804* (2013.01); *H01F 2027/2809* (2013.01); *H01G 4/008* (2013.01); *H01G 4/1227* (2013.01); *H01L 41/083* (2013.01); *H05K 2201/10015* (2013.01); *H05K 2201/10022* (2013.01); *H05K 2201/1003* (2013.01); *H05K 2201/10439* (2013.01)

(58) Field of Classification Search
USPC ............................... 336/65, 83, 192, 200, 232
See application file for complete search history.

(56) References Cited

FOREIGN PATENT DOCUMENTS

JP 2004-289090 A 10/2004

OTHER PUBLICATIONS

Sato et al.; "Method of Manufacturing Ceramic Electronic Component"; U.S. Appl. No. 13/184,607, filed Jul. 18, 2011.
(Continued)

*Primary Examiner* — Tuyen Nguyen
(74) *Attorney, Agent, or Firm* — Keating & Bennett, LLP

(57) ABSTRACT

A method of manufacturing a ceramic electronic component prevents variations in characteristics even when the ceramic electronic component is embedded in a wiring board. Ceramic green sheets containing an organic binder having a degree of polymerization in a range from about 1000 to about 1500 are prepared. A first conductive paste layer is formed on a surface of each of the ceramic green sheets. The ceramic green sheets are laminated to form a raw ceramic laminated body. A second conductive paste layer is formed on a surface of the raw ceramic laminated body. The raw ceramic laminated body formed with the second conductive paste layer is fired.

4 Claims, 17 Drawing Sheets

(51) Int. Cl.
*H01C 7/00* (2006.01)
*H01C 7/02* (2006.01)
*H01G 2/06* (2006.01)
*H01G 4/228* (2006.01)
*H01F 27/28* (2006.01)
*H01G 4/008* (2006.01)
*H01G 4/12* (2006.01)
*H01L 41/083* (2006.01)
*H05K 3/32* (2006.01)

(56) References Cited

OTHER PUBLICATIONS

Official Communication issued in corresponding Japanese Patent Application No. 2010-164112, mailed on May 7, 2014.

METHOD OF MANUFACTURING CERAMIC ELECTRONIC COMPONENT, CERAMIC ELECTRONIC COMPONENT, AND WIRING BOARD

BACKGROUND OF THE INVENTION

1. Field of the Invention

The present invention relates to a method of manufacturing a ceramic electronic component, a ceramic electronic component, and a wiring board. The present invention particularly relates to a method of manufacturing a ceramic electronic component that is preferably embedded in a wiring board, a ceramic electronic component, and a ceramic electronic component-embedded wiring board embedded with the ceramic electronic component.

2. Description of the Related Art

In recent years, along with the reduction in size and thickness of electronic devices, such as mobile phones and mobile music players, wiring boards mounted on the electronic devices have been reduced in size.

A method of reducing the size of a wiring board is proposed in, for example, Japanese Unexamined Patent Application Publication No. 2001-352141. The method embeds a chip capacitor in a wiring board, forms a through-hole with a laser in a portion of the wiring board located above the chip capacitor, and plates the interior of the through-hole, to thereby form a wiring leading to the chip capacitor. According to this method, it is possible to reduce the component mounting area on a surface of the wiring board, and to reduce the size of the wiring board.

If a chip capacitor is embedded in a wiring board by the method described in the above patent application publication, however, there arises an issue of variation in the characteristics of the wiring board embedded with the chip capacitor.

SUMMARY OF THE INVENTION

In view of the above, preferred embodiments of the present invention provide a method of manufacturing a ceramic electronic component in which variations in characteristics are prevented and minimized even when the ceramic electronic is embedded in a wiring board.

A method of manufacturing a ceramic electronic component according to a preferred embodiment of the present invention manufactures a ceramic electronic component including a substantially rectangular parallelepiped-shaped ceramic body, first and second internal electrodes, and first and second external electrodes. The ceramic body includes mutually facing first and second main surfaces extending in the length direction and the width direction, mutually facing first and second side surfaces extending in the length direction and the thickness direction, and mutually facing first and second end surfaces extending in the width direction and the thickness direction, and has a length dimension L, a width dimension W, and a thickness dimension T satisfying relationships of T≤W<L, about ⅕ W≤T≤about ½ W, and T≤about 0.3 mm. The first and second internal electrodes are arranged inside the ceramic body to at least partially face each other in the thickness direction. The first external electrode is located on an end portion of the first main surface on one side in the length direction, and is electrically connected to the first internal electrode. The second external electrode is located on an end portion of the first main surface on the other side in the length direction, and is electrically connected to the second internal electrode. In the method of manufacturing a ceramic electronic component according to the present preferred embodiment of the present invention, ceramic green sheets containing an organic binder having a degree of polymerization in a range from about 1000 to about 1500 are prepared. A surface of each of the ceramic green sheets is applied with conductive paste to form a first conductive paste layer for forming the first or second internal electrode. The ceramic green sheets are laminated to form a raw ceramic laminated body having the first conductive paste layer formed therein. A surface of the raw ceramic laminated body is supplied with conductive paste to form a second conductive paste layer for forming the first and second external electrodes. The raw ceramic laminated body formed with the second conductive paste layer is fired.

In a specific aspect of a method of manufacturing a ceramic electronic component according to a preferred embodiment of the preferred embodiment of the present invention, the method of manufacturing a ceramic electronic component may further include a pressing process of pressing the raw ceramic laminated body before the firing. The pressing process may press, via an elastic body, the raw ceramic laminated body in the thickness direction. In this case, it is possible to reduce the surface roughness of the first and second external electrodes. When laser light is applied to the first and second external electrodes, therefore, it is possible to prevent diffuse reflection of the laser light from the respective surfaces of the first and second external electrodes.

In another specific aspect of a method of manufacturing a ceramic electronic component according to a preferred embodiment of the preferred embodiment of the present invention, the method of manufacturing a ceramic electronic component may further include a step of performing Cu-plating on the fired second conductive paste layer. In this case, it is possible to increase the reflectance of the laser light from the first and second external electrodes.

In another specific aspect of a method of manufacturing a ceramic electronic component according to a preferred embodiment of the present invention, polyvinyl butyral having a degree of polymerization in a range from about 1000 to about 1500 may be used as the organic binder.

A ceramic electronic component according to a preferred embodiment of the present invention includes a substantially rectangular parallelepiped-shaped ceramic body, first and second internal electrodes, and first and second external electrodes. The ceramic body includes first and second main surfaces, first and second side surfaces, and first and second end surfaces. The first and second main surfaces extend in the length direction and the width direction, and face each other. The first and second side surfaces extend in the length direction and the thickness direction, and face each other. The first and second end surfaces extend in the width direction and the thickness direction, and face each other. The ceramic body has a length dimension L, a width dimension W, and a thickness dimension T satisfying relationships of T≤W<L, about ⅕ W≤T≤about ½ W, and T≤about 0.3 mm. The first and second internal electrodes are arranged inside of the ceramic body to at least partially face each other in the thickness direction. The first external electrode is located on an end portion of the first main surface on one side in the length direction, and is electrically connected to the first internal electrode. The second external electrode is located on an end portion of the first main surface on the other side in the length direction, and is electrically connected to the second internal electrode. When a plane passes through a portion of the first main surface corresponding to the location of an end portion of the first external electrode on the other side in the length direction and a portion of the first main surface corresponding to the location of an end portion of the second external electrode on the one side in the length direction, the distance between the plane and a portion of the first main surface most distant from the plane is about 4.9 μm or less.

In a specific aspect of a ceramic electronic component according to a preferred embodiment of the present invention, the surface roughness (Ra) of the respective surfaces of the first and second external electrodes may be about 1.55 μm or less. According to this configuration, it is possible to reduce the surface roughness of the first and second external electrodes. When laser light is applied to the first and second external electrodes, therefore, it is possible to prevent diffuse reflection of the laser light from the respective surfaces of the first and second external electrodes.

In various preferred embodiments of the present invention, the surface roughness (Ra) refers to arithmetic mean roughness Ra specified in JIS B0601-1994.

A wiring board according to a preferred embodiment of the present invention includes the above-described ceramic electronic component according to a preferred embodiment of the present invention, and a wiring board body embedded with the ceramic electronic component.

In a specific aspect of a wiring board according to a preferred embodiment of the present invention, the wiring board body may be formed with through-holes opening toward the first and second external electrodes of the ceramic electronic component.

According to various preferred embodiments of the present invention, it is possible to provide a method of manufacturing a ceramic electronic component with minimized variation in characteristics even when embedded in a wiring board, and to provide a ceramic electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A first preferred embodiment of the present invention will be described below with reference to a ceramic electronic component 1 illustrated in FIG. 1 as an example. The ceramic electronic component 1, however, is only an example. The present invention is not limited at all by the ceramic electronic component 1 and a manufacturing method thereof described below.

Figure 1:
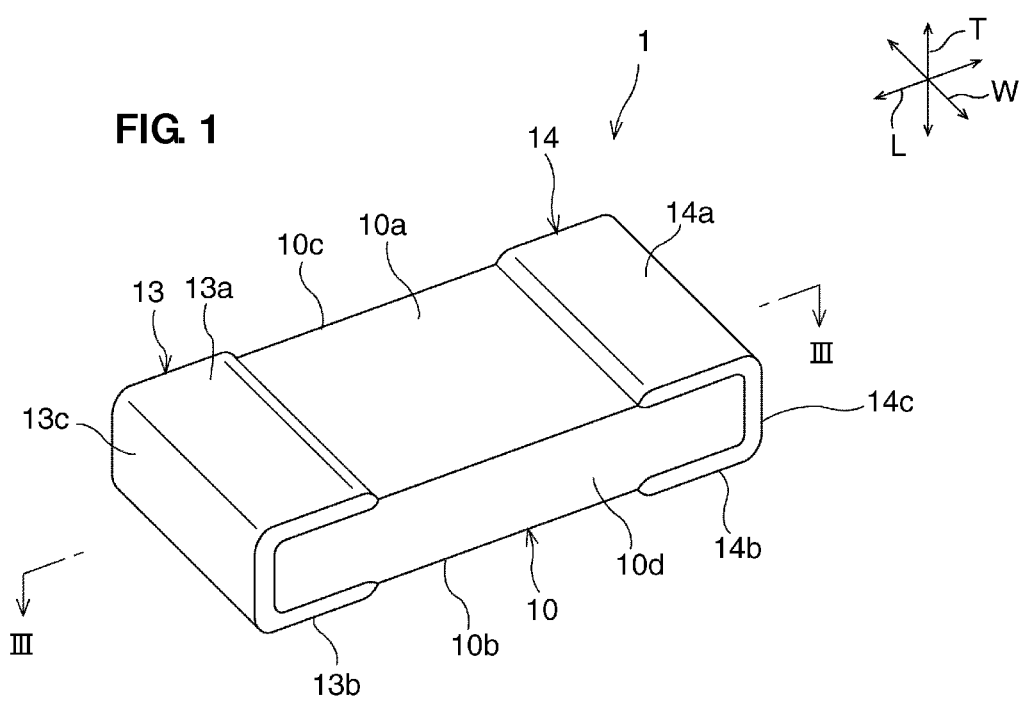
FIG. 1 is a schematic perspective view of a ceramic electronic component according to a first preferred embodiment of the present invention.
Figure 2:
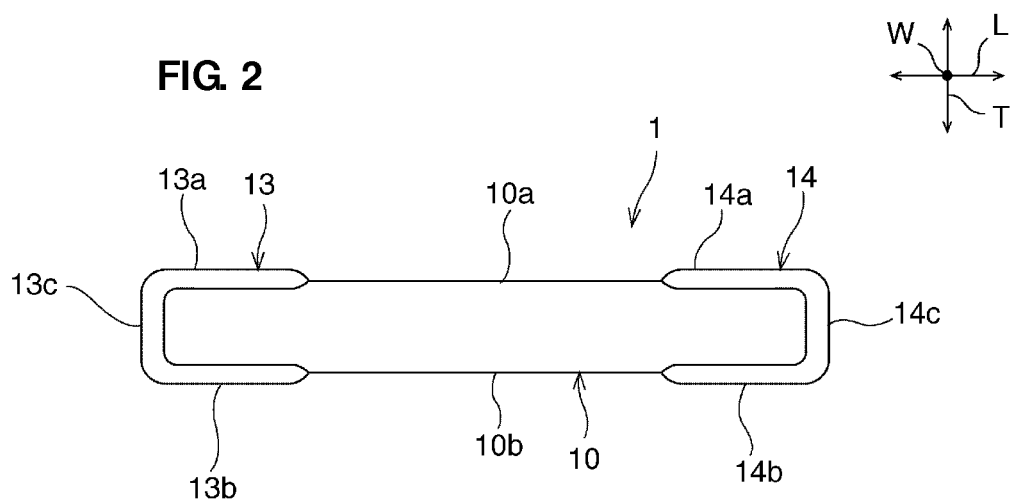
FIG. 2 is a schematic side view of the ceramic electronic component according to the first preferred embodiment of the present invention.
Figure 3:
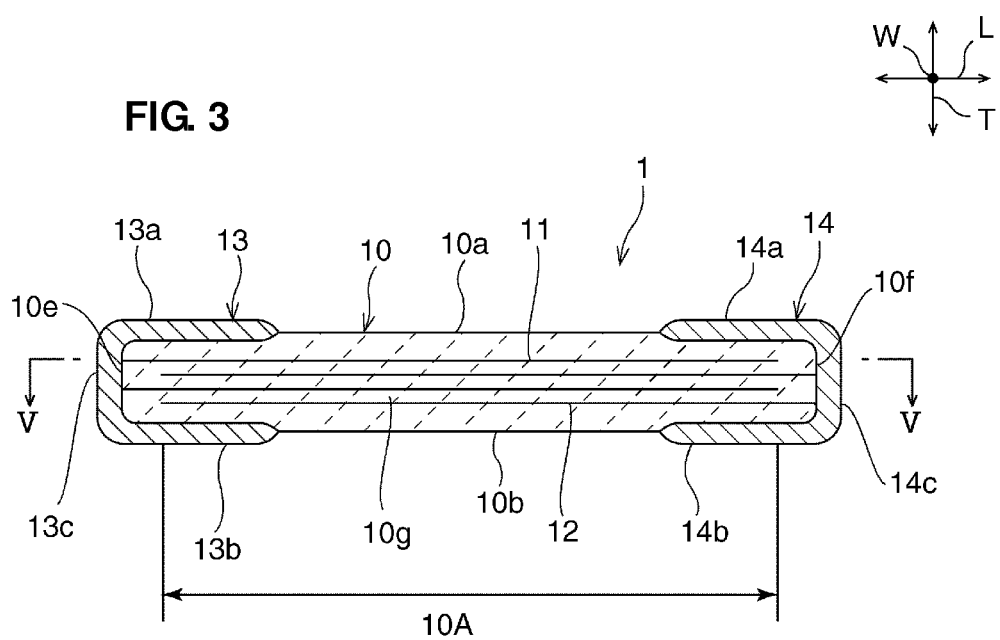
FIG. 3 is a schematic cross-sectional view of FIG. 1 taken along the line III-III.
Figure 4:
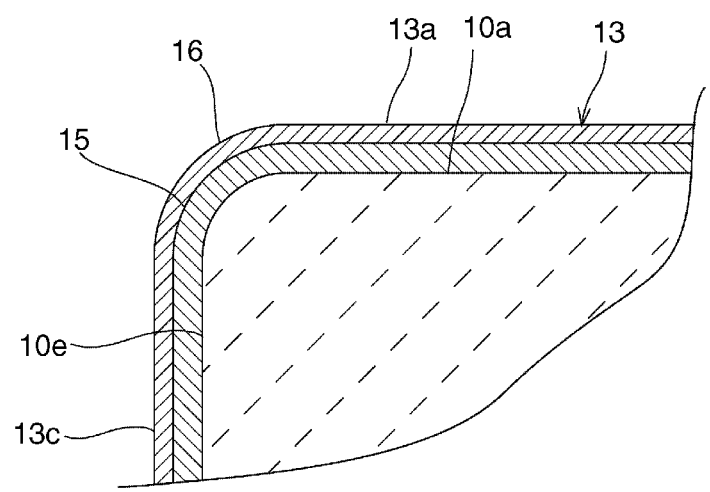
FIG. 4 is an enlarged schematic cross-sectional view of a part of the ceramic electronic component according to the first preferred embodiment of the present invention.
Figure 5:
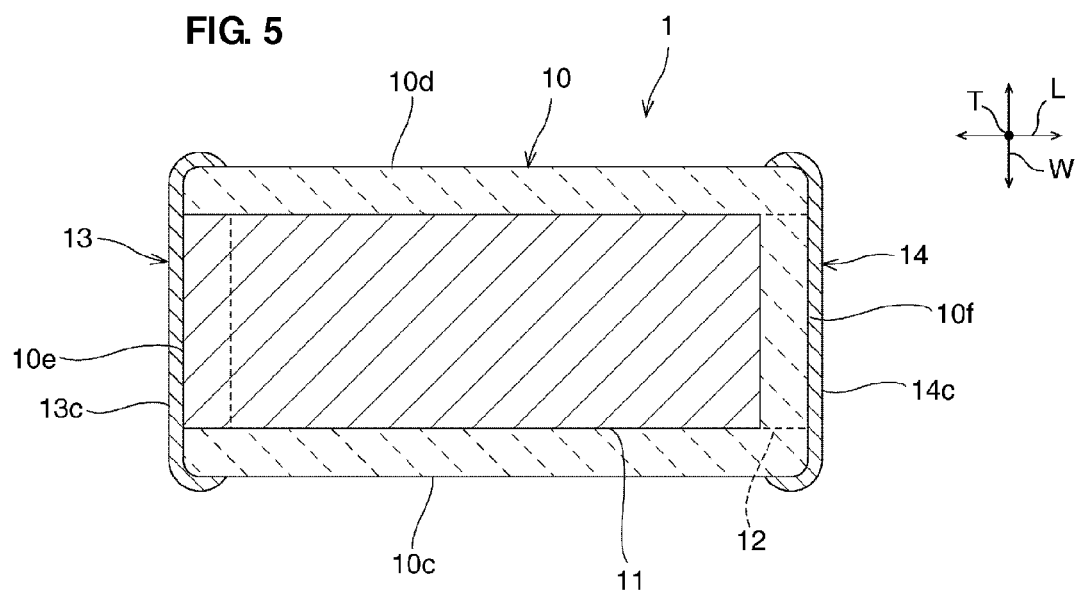
FIG. 5 is a schematic cross-sectional view of FIG. 3 taken along the line V-V.

FIG. 1 is a schematic perspective view of a ceramic electronic component according to a first preferred embodiment. FIG. 2 is a schematic side view of the ceramic electronic component according to the first preferred embodiment. FIG. 3 is a schematic cross-sectional view of FIG. 1 taken along the line III-III. FIG. 4 is an enlarged schematic cross-sectional view of a portion of the ceramic electronic component according to the first preferred embodiment. FIG. 5 is a schematic cross-sectional view of FIG. 3 taken along the line V-V.

With reference to FIGS. 1 to 5, the configuration of the ceramic electronic component 1 will be first described.

As illustrated in FIGS. 1 to 3, the ceramic electronic component 1 includes a ceramic body 10. The ceramic body 10 is made of a suitable ceramic material according to the functions of the ceramic electronic component 1. Specifically, if the ceramic electronic component 1 is a capacitor, the ceramic body 10 may be made of a dielectric ceramic material. Specific examples of the dielectric ceramic material include, for example, $BaTiO_3$, $CaTiO_3$, $SrTiO_3$, and $CaZrO_3$. In the ceramic body 10, the above-described ceramic material serving as a main ingredient may be added as appropriate with an accessory ingredient, such as a Mn compound, a Mg compound, a Si compound, an Fe compound, a Cr compound, a Co compound, a Ni compound, and a rare earth compound, for example, in accordance with the desired characteristics of the ceramic electronic component 1.

If the ceramic electronic component 1 is a ceramic piezoelectric element, the ceramic body 10 may be made of a piezoelectric ceramic material. Specific examples of the piezoelectric ceramic material include, for example, a PZT (lead zirconate titanate)-based ceramic material.

If the ceramic electronic component 1 is a thermistor element, the ceramic body 10 may be made of a semiconductor ceramic material. Specific examples of the semiconductor ceramic material include, for example, a spinel-based ceramic material.

If the ceramic electronic component 1 is an inductor element, the ceramic body 10 may be made of a magnetic ceramic material. Specific examples of the magnetic ceramic material include, for example, a ferrite ceramic material.

The ceramic body 10 is formed preferably into a substantially rectangular parallelepiped shape, for example. As illustrated in FIGS. 1 to 3, the ceramic body 10 includes first and second main surfaces 10a and 10b, first and second side surfaces 10c and 10d, and first and second end surfaces 10e and 10f. As illustrated in FIGS. 1 to 3, the first and second main surfaces 10a and 10b extend in the length direction L and the width direction W, and face each other. As illustrated in FIGS. 1 and 5, the first and second side surfaces 10c and 10d extend in the thickness direction T and the length direction L, and face each other. As illustrated in FIGS. 3 and 5, the first and second end surfaces 10e and 10f extend in the thickness direction T and the width direction W, and face each other.

In the present specification, the term "substantially rectangular parallelepiped shape" includes a substantially rectangular parallelepiped having corner portions and ridgeline portions square-chamfered or round-chamfered. That is, a member having a "substantially rectangular parallelepiped shape" refers to any member having first and second main surfaces, first and second side surfaces, and first and second end surfaces. Further, portions of or all of the main surfaces, the side surfaces, and the end surfaces may have irregularities. That is, each of the main surfaces, the side surfaces, and the end surfaces is not necessarily required to be flat.

The dimensions of the ceramic body 10 are not particularly limited. However, when the thickness dimension, the length dimension, and the width dimension of the ceramic body 10 are represented as T, L, and W, respectively, it is preferred that the ceramic body 10 be thin enough to satisfy relationships of T≤W<L, about ⅕ W≤T≤about ½ W, and T≤about 0.3 mm, for example. Specifically, it is preferred that the ceramic body 10 have dimensions of about 0.1 mm≤T≤about 0.3 mm, about 0.4 mm≤L≤about 1 mm, and about 0.2 mm≤W≤about 0.5 mm, for example.

The thickness of a ceramic layer 10g (see FIG. 3) is not particularly limited. The thickness of the ceramic layer 10g may be set in, for example, a range from about 0.5 µm to about 10 µm.

As illustrated in FIG. 3, inside the ceramic body 10, a plurality of substantially rectangular first and second internal electrodes 11 and 12 are alternately arranged at regular intervals in the thickness direction T. Each of the first and second internal electrodes 11 and 12 is parallel or substantially parallel to the first and second main surfaces 10a and 10b.

As illustrated in FIG. 3, the first internal electrode 11 is arranged to extend in the length direction L and the width direction W. The first internal electrode 11 is exposed to the first end surface 10e of the ceramic body 10, and extends from the first end surface 10e toward the second end surface 10f. The first internal electrode 11 does not reach the second end surface 10f and the first and second side surfaces 10c and 10d. Meanwhile, the second internal electrode 12 is arranged to also extend in the length direction L and the width direction W. As illustrated in FIG. 3, the second internal electrode 12 is exposed to the second end surface 10f of the ceramic body 10, and extends from the second end surface 10f toward the first end surface 10e. The second internal electrode 12 does not reach the first end surface 10e and the first and second side surfaces 10c and 10d. The first and second internal electrodes 11 and 12 are located at the same position in the width direction W. Therefore, the first and second internal electrodes 11 and 12 face each other via the ceramic layer 10g in a central portion of the ceramic body 10 in the length direction L. The first and second internal electrodes 11 and 12 do not face each other in the thickness direction T in opposite end portions of the ceramic body 10 in the length direction L.

A portion of the ceramic body 10, in which the first and second internal electrodes 11 and 12 face each other, defines an effective portion 10A exhibiting the functions of a capacitor.

The material forming the first and second internal electrodes 11 and 12 is not particularly limited. The first and second internal electrodes 11 and 12 may be made of, for example, a metal, such as Ni, Cu, Ag, Pd, and Au, or an alloy containing one or more of the metals, such as an Ag—Pd alloy.

Further, the thickness of the first and second internal electrodes 11 and 12 is not particularly limited. The thickness of the first and second internal electrodes 11 and 12 may be set in, for example, a range from about 0.3 µm to about 2 µm.

As illustrated in FIGS. 1 to 3, first and second external electrodes 13 and 14 are provided on the surface of the ceramic body 10. The first external electrode 13 is electrically connected to the first internal electrode 11. The first external electrode 13 includes a first portion 13a located on an end portion of the first main surface 10a on one side in the length direction L, a second portion 13b located on the second main surface 10b, and a third portion 13c located on the first end surface 10e. In the present preferred embodiment, the first external electrode 13 is preferably arranged to slightly wrap around respective end portions of the first and second side surfaces 10c and 10d in the length direction L. Specifically, the length in the length direction L of the first external electrode 13 on the first and second side surfaces 10c and 10d is less than half of the length in the length direction L of the first portion 13a. Further, the first external electrode 13 hardly projects from the first and second side surfaces 10c and 10d in the width direction W. With this configuration, it is possible to reduce the dimension of the ceramic electronic component 1 in the width direction W. The first external electrode 13 may be configured not to be substantially formed on the first and second side surfaces 10c and 10d.

Meanwhile, the second external electrode 14 is electrically connected to the second internal electrode 12. The second external electrode 14 includes a first portion 14a located on an end portion of the first main surface 10a on the other side in the length direction L, a second portion 14b located on the second main surface 10b, and a third portion 14c located on the second end surface 10f. In the present preferred embodiment, the second external electrode 14 is arranged to slightly wrap around respective end portions of the first and second side surfaces 10c and 10d in the length direction L. Specifically, the length in the length direction L of the second external electrode 14 on the first and second side surfaces 10c and 10d is less than half the length in the length direction L of the first portion 14a. Further, the second external electrode 14 hardly projects from the first and second side surfaces 10c and 10d in the width direction W. With this configuration, it is possible to reduce the dimension of the ceramic electronic component 1 in the width direction W. The second external electrode 14 may be configured not to be substantially provided on the first and second side surfaces 10c and 10d.

In the present preferred embodiment, the first and second portions 13a and 13b and 14a and 14b of the first and second external electrodes 13 and 14 partially face the effective portion 10A in the thickness direction T.

Subsequently, with reference to FIG. 4, description will be made of the specific configuration of the first and second external electrodes 13 and 14 of the present preferred embodiment. The first and second external electrodes 13 and 14 are preferably defined by a laminated body including first and second conductive layers 15 and 16. The first conductive layer is located on the ceramic body 10. The second conductive layer 16 is location on a portion of the first conductive layer 15. In the present preferred embodiment, therefore, the second conductive layer 16 defines the outermost layer of the first and second external electrodes 13 and 14.

The first conductive layer 15 may be made of a suitable conductive material. The first conductive layer 15 may be made of, for example, a metal, such as Ni, Cu, Ag, Pd, and Au, or an alloy containing one or more of the metals, such as an Ag—Pd alloy. The thickness of the first conductive layer 15 may be set in, for example, a range from about 3 μm to about 20 μm.

The first conductive layer 15 preferably includes an inorganic bonding material. The inorganic bonding material is an ingredient for enhancing the adhesion strength to the ceramic body 10. If the first conductive layer 15 is formed by co-firing, the inorganic bonding material is also called a common material, and may be, for example, a ceramic material which is the same type as the ceramic material contained in the ceramic body 10. The inorganic bonding material may be, for example, a ceramic material whose main ingredient is the same as that of the ceramic material contained in the ceramic body 10. Further, if the first conductive layer 15 is formed by post-firing, the inorganic bonding material may be, for example, a glass ingredient.

The content of the inorganic bonding material in the first conductive layer 15 is preferably in, for example, a range from about 40 volume percent to about 60 volume percent.

In the second conductive layer 16, it is preferred to use, for example, a metal selected from a group of Cu, Ni, Sn, Pb, Au, Ag, Pd, Al, Bi, and Zn or an alloy containing the metal.

In particular, if the ceramic electronic component 1 is embedded in a wiring board, it is preferred to use, as the metal defining the outermost layer of a plated layer, a metal selected from a group of Cu, Au, Ag, and Al or an alloy containing the metal. This is because laser light passing through the wiring board is applied, in some cases, to the first and second external electrodes 13 and 14 in the embedding process, and the above-described metals effectively reflect the laser light.

The second conductive layer 16 preferably includes a plated film, and the thickness thereof is preferably in a range from about 1 μm to about 15 μm, for example.

Further, the second conductive layer 16 is preferably arranged to completely cover the first conductive layer 15.

Further, another conductive layer, such as a resin layer, for example, may be provided between the second conductive layer 16 and the first conductive layer 15.

In the present preferred embodiment, the first portions 13a and 14a and the second portions 13b and 14b of the first and second external electrodes 13 and 14 are partially embedded in the first main surface 10a and the second main surface 10b, respectively. Therefore, the portions of the first and second main surfaces 10a and 10b, on which the first and second portions 13a and 13b and 14a and 14b are located, are located closer to the center in the thickness direction T than the portions of the first and second main surfaces 10a and 10b, on which the first and second portions 13a and 13b and 14a and 14b are not located.

It is now assumed that t0 represents the thickness of each of the first and second portions 13a and 13b and 14a and 14b of the first and second external electrodes 13 and 14, and that $t_1$ represents the thickness of a portion of each of the first and second portions 13a and 13b and 14a and 14b of the first and second external electrodes 13 and 14 embedded in the ceramic body 10. In this case, the thicknesses $t_1$ and $t_0$ preferably satisfy a relationship of about $1/10\, t_0 \leq t_1$ —about $2/5 \cdot t_0$ in the present preferred embodiment. Therefore, the reduction in thickness and high reliability of the ceramic electronic component 1 are both reliably achieved.

If the thickness $t_1$ is less than about $1/10\, t_0$, the adhesion between the ceramic body 10 and the first and second portions 13a and 13b and 14a and 14b of the first and second external electrodes 13 and 14 is excessively reduced, and the first and second portions 13a and 13b and 14a and 14b easily separate from the ceramic body 10. As a result, the reliability is reduced in some cases. Further, if the thickness $t_1$ is less than about $1/10\, t_0$, a thickness $t_2$ of the non-embedded portion of each of the first and second portions 13a and 13b and 14a and 14b of the first and second external electrodes 13 and 14 is excessively increased. As a result, a sufficient reduction in thickness of the ceramic electronic component 1 is not attained in some cases.

Meanwhile, if the thickness $t_1$ is more than about $2/5 \cdot t_0$, the reliability of the ceramic electronic component 1 is reduced in some cases. This is considered to be because, when the first and second portions 13a and 13b and 14a and 14b are embedded into the ceramic body 10, the first and second internal electrodes 11 and 12 are applied with large stress and damaged, and a failure to obtain a desired capacitance or a short-circuit occurs.

In the present preferred embodiment, the thickness to may be set in, for example, a range from about 10 μm to about 50 μm.

Subsequently, an example of a method of manufacturing the ceramic electronic component 1 of the present preferred embodiment will be described mainly with reference to FIGS. 6 to 8.

A ceramic green sheet 20 (see FIG. 6) containing a ceramic material for forming the ceramic body 10 and an organic binder is first prepared. Herein, the degree of polymerization of the organic binder is set in a range from about 1000 to about 1500 in the present preferred embodiment. Specific examples of a preferably used organic binder include, for example, polyvinyl butyral (PVB) having a degree of polymerization in a range from about 1000 to about 1500.

Figure 6:
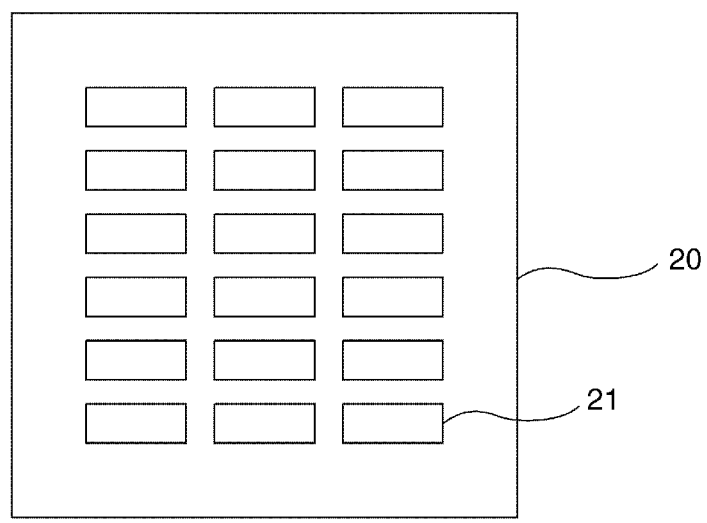
FIG. 6 is a schematic plan view of a ceramic green sheet formed with conductive patterns.

Then, as illustrated in FIG. 6, conductive paste is applied onto the ceramic green sheet 20 to form a first conductive paste layer 21 for forming the first or second internal electrodes 11 or 12. The application of conductive patterns may be performed by a variety of printing methods, such as a screen printing method, for example. The conductive paste may contain a publicly known binder or solvent, as well as conductive microparticles.

Then, the ceramic green sheets 20 not formed with the first conductive paste layer 21 and the ceramic green sheets 20 formed with the first conductive paste layer 21 are laminated with the respective positions thereof shifted as appropriate in the length direction L, and are pressed in the direction of lamination by a method such as isostatic pressing. Thereby, a mother laminated body 22 illustrated in FIG. 7 is produced.

Figure 7:
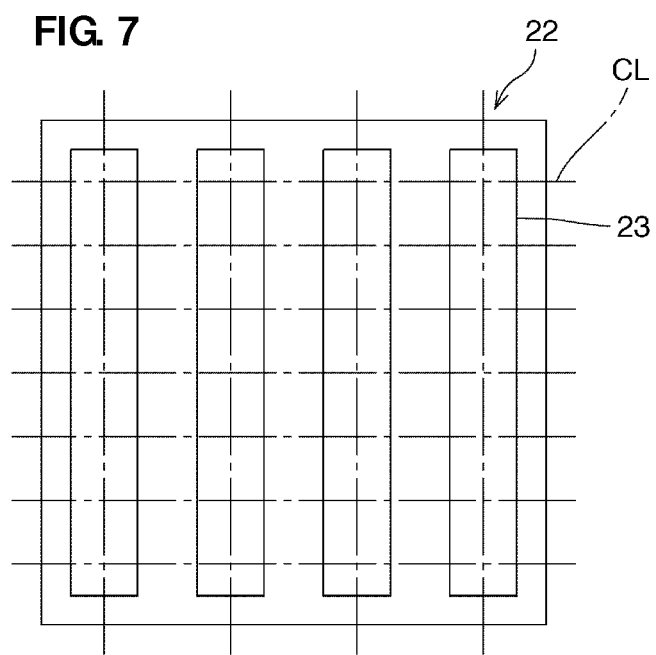
FIG. 7 is a schematic plan view of a mother laminated body.
Figure 8:
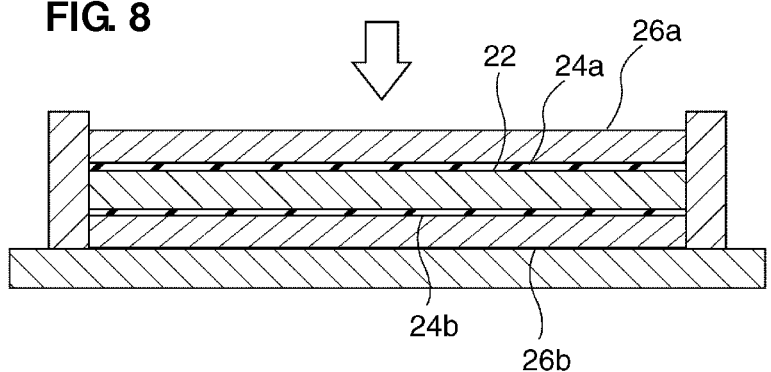
FIG. 8 is a schematic cross-sectional view for explaining a pressing process of the mother laminated body.

Then, as illustrated in FIG. 7, conductive paste is applied onto the mother laminated body 22 by a suitable printing method, such as a screen printing method. As a result, a second conductive paste layer 23 is formed which has a shape corresponding to the portions of the first conductive layer 15 of the first and second external electrodes 13 and 14 defining the first and second portions 13a and 13b and 14a and 14b.

Then, the mother laminated body 22 is pressed again in the direction of lamination (thickness direction). With this pressing process, the second conductive paste layer 23 is partially embedded. The amount of embedding of the second conductive paste layer 23 can be adjusted by the adjustment of, for example, the pressing amount, the pressing pressure, or the hardness or modulus of elasticity of a member which comes into contact with the mother laminated body 22 in the pressing process.

Specifically, for example, if the mother laminated body 22 is pressed without an elastic body, such as rubber, interposed between each of the opposite main surfaces of the mother laminated body 22 and a die facing the main surface, the amount of embedding of the second conductive paste layer 23 is increased. Meanwhile, if the pressing is performed with elastic bodies 24a and 24b, such as rubber, respectively arranged in contact with dies 26a and 26b and the opposite main surfaces of the mother laminated body 22 facing the dies 26a and 26b, as illustrated in FIG. 8, the amount of embedding is relatively reduced. Further, the amount of embedding can be adjusted by the adjustment of, for example, the modulus of elasticity of the elastic bodies 24a and 24b.

Further, with this pressing process, it is possible to reduce the surface roughness of the surface of the second conductive paste layer 23, and thus to reduce the surface roughness of the respective surfaces of the first and second external electrodes 13 and 14.

Then, the mother laminated body 22 is cut along virtual cut lines CL illustrated in FIG. 7. Thereby, a plurality of raw ceramic laminated bodies are produced from the mother laminated body 22. The cutting of the mother laminated body 22 may be performed by dicing or press-cutting.

After the raw ceramic laminated bodies are formed, square-chamfering or round-chamfering of corner portions and ridgeline portions and polishing of the surface layer may be performed on each of the raw ceramic laminated bodies by barrel polishing or other suitable process.

Thereafter, the opposite end surfaces of the raw ceramic laminated body are applied with conductive paste by, for example, a dipping method. Thereby, each of the opposite end surfaces of the ceramic laminated body is also formed with a conductive paste layer.

Then, the raw ceramic laminated body is fired. In the firing process, the above formed conductive paste layers are simultaneously fired (co-fired). The firing temperature may be set as appropriate in accordance with the type of the ceramic material and the conductive paste to be used. The firing temperature may be set in, for example, a range from about 900° C. to about 1300° C.

Thereafter, polishing, such as barrel polishing, is performed as required.

The simultaneously fired conductive paste layers are subjected to plating, such as Cu plating, for example. Thereby, the second conductive layer 16 is formed, and the first and second external electrodes 13 and 14 are completed.

The ceramic electronic component 1 of the present preferred embodiment is preferably embedded in a wiring board. Subsequently, a method of manufacturing a ceramic electronic component-embedded wiring board embedded with the ceramic electronic component 1 will be described mainly with reference to FIGS. 9 to 13.

Figure 9:
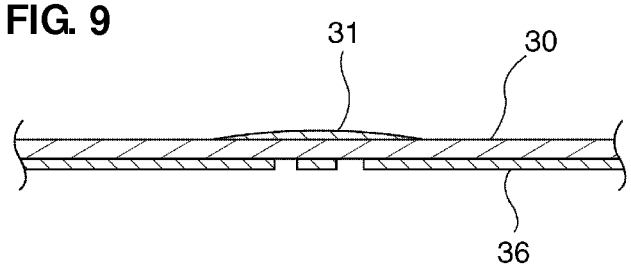
FIG. 9 is a schematic cross-sectional view for explaining a process of applying an adhesive to a base board.

As illustrated in FIG. 9, an adhesive 31 is first applied onto a base board 30. The base board 30 is not particularly limited. The base board 30 may be formed by a resin board or other suitable material made of, for example, a glass epoxy resin. Further, the thickness of the base board 30 is not particularly limited, and may be set in, for example, a range from about 25 μm to about 50 μm. As the adhesive 31, an epoxy resin-based adhesive may be used, for example. The adhesive 31 may be, for example, a heat-curing resin adhesive or a light-curing resin adhesive.

Figure 10:
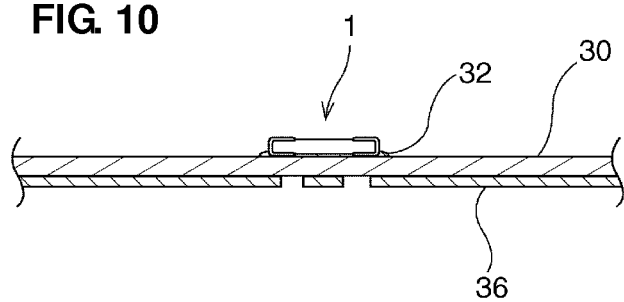
FIG. 10 is a schematic cross-sectional view for explaining a process of bonding the ceramic electronic component to the base board.

Then, the ceramic electronic component 1 is disposed on the adhesive 31, and the adhesive 31 is cured to form an adhesive 32, as illustrated in FIG. 10. As a result, the ceramic electronic component 1 is bonded to the base board 30.

Figure 11:
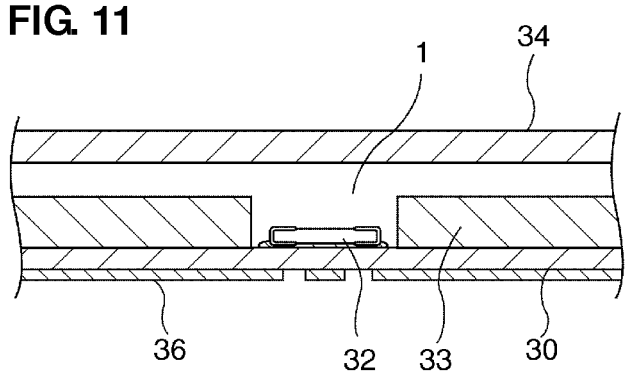
FIG. 11 is a schematic cross-sectional view for explaining a process of forming a wiring board body.
Figure 12:
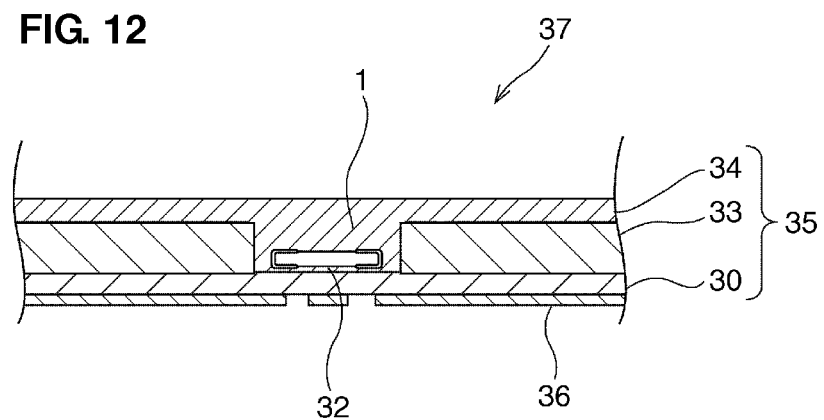
FIG. 12 is a schematic cross-sectional view for explaining a process of forming a via hole.
Figure 13:
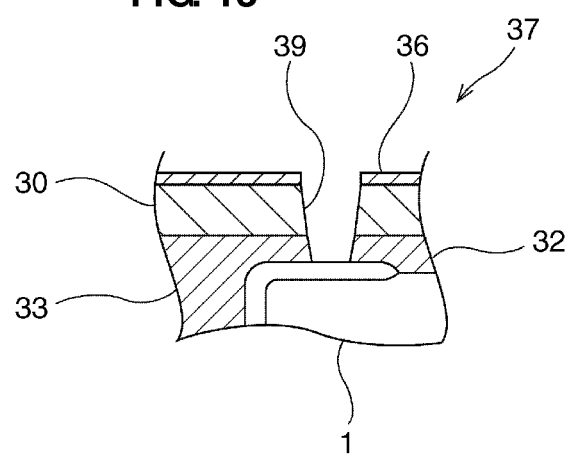
FIG. 13 is an enlarged schematic cross-sectional view of a part of a wiring board.

Then, as illustrated in FIG. 11, a core material 33 is disposed on a portion of the base board 30, on which the ceramic electronic component 1 is not disposed. Further, a sheet 34 containing a curing resin in a half-cured state is placed on and pressed against the core material 33 and the ceramic electronic component 1. In this state, the sheet 34 is fully cured. Thereby, as illustrated in FIG. 12, a wiring board 37 can be completed which includes the ceramic electronic component 1 embedded in a wiring board body 35 formed by the base board 30, the core material 33, and the sheet 34. The core material 33 may be formed by a resin board or other suitable material made of, for example, a glass epoxy resin.

Then, laser light is applied to the wiring board 37 from above a Cu layer 36 patterned on the base board 30 (conformal mask method). Thereby, a via hole 39 (see FIG. 13) opening to the first or second external electrode 13 or 14 is formed in the wiring board 37. Preferably, the spot diameter of the laser light is about 100 μm, for example. Therefore, the length in the length direction L of each of the first portions 13a and 14a is preferably in a range from about 170 μm to about 250 μm, for example.

Thereafter, a desmearing process is performed to remove smear adhering to the side wall of the via hole 39 and so forth. Specifically, the smear is removed by a treatment using a strong alkaline substance, such as potassium permanganate, and thereafter acid rinsing is performed.

Plating, such as electroless plating, may be further performed to form, in the via hole 39, a conductor connected to the first or second external electrode 13 or 14.

Meanwhile, in a related art ceramic electronic component formed into a substantially prismatic shape and including a multitude of first and second internal electrodes, the ceramic electronic component is resistant to warping in the thickness direction T, and the warp of the ceramic electronic component has not been a major issue. However, in a thin and substantially flat ceramic electronic component, as in the present preferred embodiment in which the relationships of T≤W<L, about ⅕ W≤T≤about ½ W, and T≤about 0.3 mm hold, the thickness dimension T of the ceramic body 10 is small. Therefore, an issue arises in that the ceramic body 10 is subject to warping in the thickness direction T.

Figure 14:
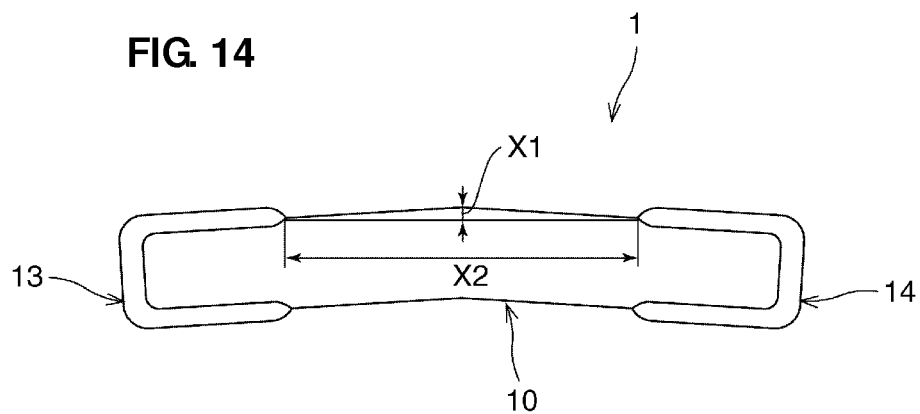
FIG. 14 is a schematic view for explaining the amount of warping of the ceramic electronic component.
Figure 15:
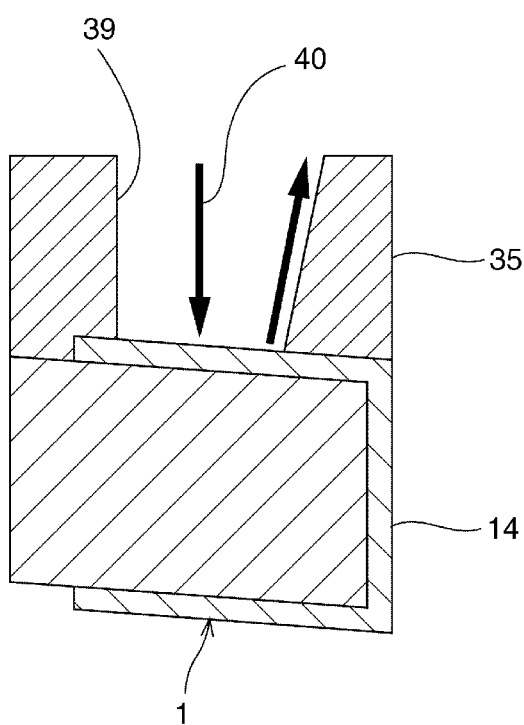
FIG. 15 is a schematic view for explaining a process of forming a via hole with laser light, when a ceramic body is warped.

For example, as illustrated in FIG. 14, if the ceramic body 10 warps in the thickness direction T, when a wiring board embedded with the ceramic electronic component 1 is applied with laser light to form a via hole, laser light 40 is reflected in a different direction from the incident direction by the first or second external electrode 13 or 14, as schematically illustrated in FIG. 15. Therefore, the via hole 39 is formed into an undesired shape. As a result, the electrical characteristics of the wiring board 37 embedded with the ceramic electronic component 1 vary.

Meanwhile, in the present preferred embodiment, the degree of polymerization of the organic binder contained in the ceramic green sheet 20 (see FIG. 6) is preferably set in a range from about 1000 to about 1500, for example. It is therefore possible to reduce the amount of warping of the ceramic body 10, as supported by experiment examples described later. Specifically, when a plane passes through a portion of the first main surface corresponding to the location of an end portion of the first external electrode on the other side in the length direction and a portion of the first main surface corresponding to the location of an end portion of the second external electrode on the one side in the length direction, it is possible to set a distance X1 between the plane and a portion of the first main surface most distant from the plane to about 4.9 μm or less, for example. It is thereby possible to preferably reduce the amount of warping of the ceramic body 10. Accordingly, it is possible to form the via hole 39 with high accuracy, and to prevent variations in the electrical characteristics of the wiring board 37.

Figure 16:
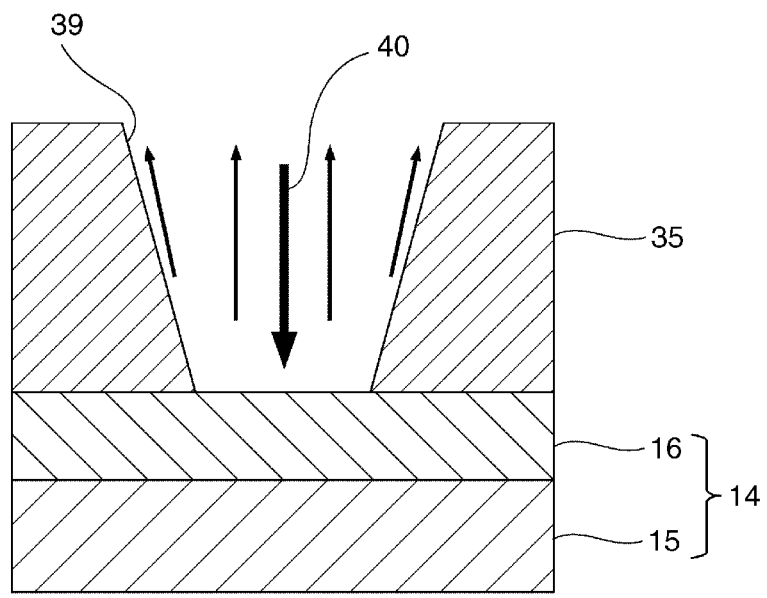
FIG. 16 is a schematic view for explaining a process of forming a via hole with laser light, when the surface of an external electrode has high surface roughness.

Further, in the present preferred embodiment, the surface roughness of the surface of the second conductive paste layer 23 is reduced by the pressing process of the mother laminated body 22 formed with the second conductive paste layer 23. Consequently, it is possible to reduce the surface roughness of the respective surfaces of the first and second external electrodes 13 and 14. Specifically, it is possible to reduce the surface roughness (Ra) of the respective surfaces of the first and second external electrodes 13 and 14 to about 1.55 μm or less, for example. As illustrated in FIG. 16, therefore, it is possible to prevent scattered reflection of the laser light 40. Consequently, it is possible to further improve the accuracy of the via hole 39, and to more effectively reduce the variation in the electrical characteristics of the wiring board 37.

Another example of a preferred embodiment of the present invention will be described below. In the following description, members substantially similar in function to the members of the above-described first preferred embodiment will be designated by the same reference numerals, and description thereof will be omitted.

Second Preferred Embodiment

Figure 17:
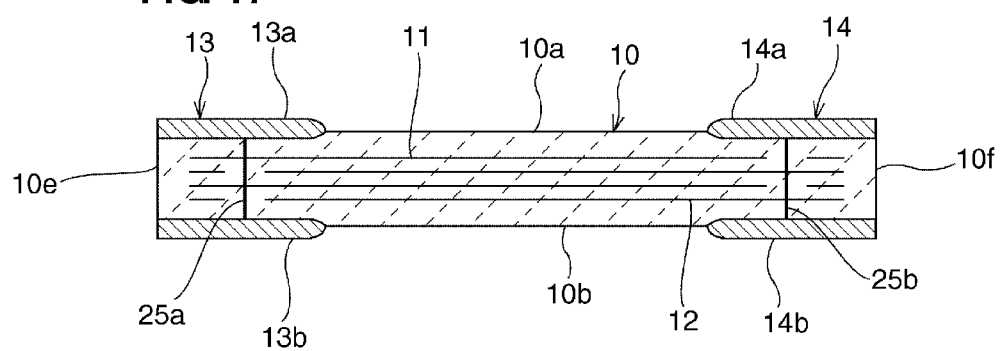
FIG. 17 is a schematic cross-sectional view of a ceramic electronic component according to a second preferred embodiment of the present invention.

FIG. 17 is a schematic cross-sectional view of a ceramic electronic component according to a second preferred embodiment of the present invention.

In the above-described first preferred embodiment, description has been made of the example in which each of the first and second internal electrodes 11 and 12 is drawn to the first or second end surface 10e or 10f, and in which each of the first and second end surfaces 10e and 10f includes the first or second external electrode 13 or 14, to thereby electrically connect each of the first and second internal electrodes 11 and 12 to the first or second external electrode 13 or 14. The present invention, however, is not limited to this configuration.

For example, as illustrated in FIG. 17, via hole electrodes 25a and 25b may be formed to draw the first and second internal electrodes 11 and 12 to the first and second main surfaces 10a and 10b and electrically connect the first and second internal electrodes 11 and 12 to the first and second external electrodes 13 and 14 on the first and second main surfaces 10a and 10b. In this case, the first and second external electrodes 13 and 14 may be formed on at least one of the first and second main surfaces 10a and 10b, and may not necessarily be formed on the first and second side surfaces 10c and 10d and the first and second end surfaces 10e and 10f.

Experiment Examples 1 to 5

As described in Table 1 given below, 10000 ceramic electronic components serving as ceramic capacitors similar in configuration to the ceramic electronic component 1 of the above-described first preferred embodiment were produced in each of the experiment examples by the manufacturing method described in the above-described first preferred embodiment with different degrees of polymerization of the binder, and were mounted on a wiring board. Then, in the mounting process, the number of ceramic electronic components that failed to be sucked by a suction head of a mounting device (the number of suction failures) was counted. Further, the number of ceramic electronic components cracked or chipped in the mounting process (the number of cracks or chips) was counted. The results are presented in Table 1 given below.

Further, the shape of the first main surface was measured with the use of a laser displacement meter to measure the distance X1. The results are presented in Table 1 given below.

Detailed conditions for Experiment Examples 1 to 5 are as follows.

Conditions for Experiment Examples 1 to 5

Thickness of ceramic layer (after firing): about 4 μm
Binder: polyvinyl butyral
Ceramic material: $BaTiO_3$
Number of internal electrodes: 23
Designed capacitance: about 100 pF
Dimensions of ceramic electronic component: length of about 1 mm, width of about 0.5 mm, and thickness of about 0.14 mm
Second conductive layer: two-layer laminated body including Cu-plated layer (total thickness: about 7.5 μm)
Maximum firing temperature: about 1200° C.
Time duration at maximum firing temperature: about two hours
Pressing pressure applied to mother laminated body after formation of second conductive paste layer: about 77.2 MPa
Thickness of core material: about 0.15 mm
Thickness of base board: about 25 μm
Length of via hole: about 25 μm
Laser light applied in via hole forming process: $CO_2$ laser
Laser light application condition: apply laser light with about 2 mj for about 16 μs

TABLE 1

| | Experiment example | | | | |
|---|---|---|---|---|---|
| | 1 | 2 | 3 | 4 | 5 |
| Degree of polymerization | 900 | 1000 | 1200 | 1500 | 1600 |
| X1 (μm) | 5.9 | 4.9 | 1.9 | 1.7 | Failed to form |
| Suction failures (number) | 48/10000 | 0/10000 | 0/10000 | 0/10000 | |
| Cracks or chips (number) | 12/10000 | 0/10000 | 0/10000 | 0/10000 | |

As described in Table 1 given above, in Experiment Example 1 with a distance X1 of more than about 4.9 μm, suction failure and cracking or chipping in the mounting process occurred in some cases. Meanwhile, in Experiment Examples 2 to 5 with a distance X1 of about 4.9 μm or less, neither suction failure nor cracking or chipping in the mounting process occurred. Experiment Example 5 with a degree of polymerization of about 1600 failed to preferably form paste, and failed to form a ceramic body. It is understood from the above results that it is preferred to set the degree of polymerization of the resin binder in a range from about 1000 to about 1500, for example, and to set the distance X1 to about 4.9 μm or less.

Experiment Examples 6 to 10

As described in Table 2 given below, thirty ceramic electronic components serving as ceramic capacitors were produced in each of Experiment Examples 6 to 10 under conditions similar to the conditions of Experiment Example 3 with different values of the pressing pressure applied to the mother laminated body after the formation of the second conductive paste layer. For each of the thirty ceramic electronic components thus produced, the shape of the first portion of the first external electrode was measured with the use of a laser displacement meter to measure the surface roughness (Ra). The results are presented in Table 2 given below.

Further, the above produced ceramic electronic components were mounted on a wiring board by the method described in the above-described first preferred embodiment. In the mounting process, laser light having a diameter of about 100 μm was applied to the first portion of the first external electrode to form a via hole. Then, the diameter of the formed via hole was measured with the use of a microscope and determined as the diameter of reflected laser light. Then, the diameter of the reflected laser light was divided by the diameter of incident laser light to calculate the scattered reflection rate. The results are presented in Table 2 given below.

TABLE 2

|  | Experiment example | | | | |
| --- | --- | --- | --- | --- | --- |
|  | 1 | 2 | 3 | 4 | 5 |
| Thickness of elastic body (mm) | 0.05 | 0.10 | 0.10 | 0.15 | 0.20 |
| Pressing Pressure (MPa) | 77.2 | 77.2 | 71.5 | 77.2 | 77.2 |
| Surface roughness (Ra) | 0.80 | 0.90 | 1.23 | 1.55 | 2.00 |
| Scattered reflection rate (%) | 3 | 3 | 5 | 8 | 12 |

It is understood from the results presented in Table 2 given above that it is possible to reduce the scattered reflection rate to about 10% or less by setting the surface roughness (Ra) of the surface of the first portion of each of the first and second external electrodes to about 1.55 μm or less.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ceramic electronic component comprising:
a substantially rectangular parallelepiped-shaped ceramic body including mutually facing first and second main surfaces extending in a length direction and a width direction, mutually facing first and second side surfaces extending in the length direction and a thickness direction, and mutually facing first and second end surfaces extending in the width direction and the thickness direction, and having a length dimension L, a width dimension W, and a thickness dimension T satisfying relationships of T≤W<L, about ⅕ W≤T≤about ½ W, and T≤about 0.3 mm;
first and second internal electrodes located inside the ceramic body to at least partially face each other in the thickness direction;
a first external electrode located on an end portion of the first main surface on one side in the length direction, and electrically connected to the first internal electrode; and
a second external electrode located on an end portion of the first main surface on the other side in the length direction, and electrically connected to the second internal electrode; wherein
when a plane passes through a portion of the first main surface corresponding to a location of an end portion of the first external electrode on the other side in the length direction and a portion of the first main surface corresponding to a location of an end portion of the second external electrode on the one side in the length direction, a distance between the plane and a portion of the first main surface most distant from the plane is about 4.9 μm or less.
2. The ceramic electronic component according to claim 1, wherein a surface roughness Ra of respective surfaces of the first and second external electrodes is about 1.55 μm or less.
3. A wiring board comprising:
the ceramic electronic component according to claim 1; and
a wiring board body embedded with the ceramic electronic component.
4. The wiring board according to claim 3, wherein the wiring board body includes through-holes opening toward the first and second external electrodes of the ceramic electronic component.

* * * * *